United States Patent [19]

Shaw et al.

[11] 4,326,171

[45] Apr. 20, 1982

[54] TEMPERATURE COMPENSATING PRESSURE SENSOR AMPLIFIER CIRCUITS

[75] Inventors: Mark L. Shaw, Mesa; Ronald J. Freimark, Scottsdale, both of Ariz.

[73] Assignee: Motorola, Inc., Schaumburg, Ill.

[21] Appl. No.: 140,070

[22] Filed: Apr. 14, 1980

[51] Int. Cl.³ .............................................. H03F 3/45
[52] U.S. Cl. .................................. 330/256; 330/289; 328/3
[58] Field of Search ............... 328/1, 3; 307/308, 310; 330/256, 289

[56] References Cited

U.S. PATENT DOCUMENTS 3,967,188   6/1976   Spencer .............................. 307/310

OTHER PUBLICATIONS

Katsuhiko Kawashima, "A New Temperature Compensating Method for Logarithmic Amplifier" IEEE Transactions, Nuclear Science, vol. 17 No. 5, Oct. 1970.

*Primary Examiner*—James B. Mullins
*Assistant Examiner*—Gene Wan

*Attorney, Agent, or Firm*—Vincent B. Ingrassia

[57] ABSTRACT

An amplifier circuit is disclosed for temperature compensating the output voltage thereof with respect to undesirable temperature induced signals from a silicon pressure transducer and/or from components of the amplifier itself. The amplifier includes a first operational amplifier and a second operational amplifier. A first circuit connects the output terminal of the first operational amplifier through a summing node to one input terminal of the second amplifier. Output signals from the pressure transducer are applied between one input terminal of the first operational amplifier and another input terminal of the second amplifier. A temperature compensating circuit is connected to the summing node for enabling the output voltage of the amplifier to be substantially independent of temperature. An initial offset voltage compensating circuit is coupled to the summing node for adjusting the intercept of the pressure-to-output voltage transfer curve. The gain of the second operational amplifier determines the slope of the curve.

8 Claims, 2 Drawing Figures

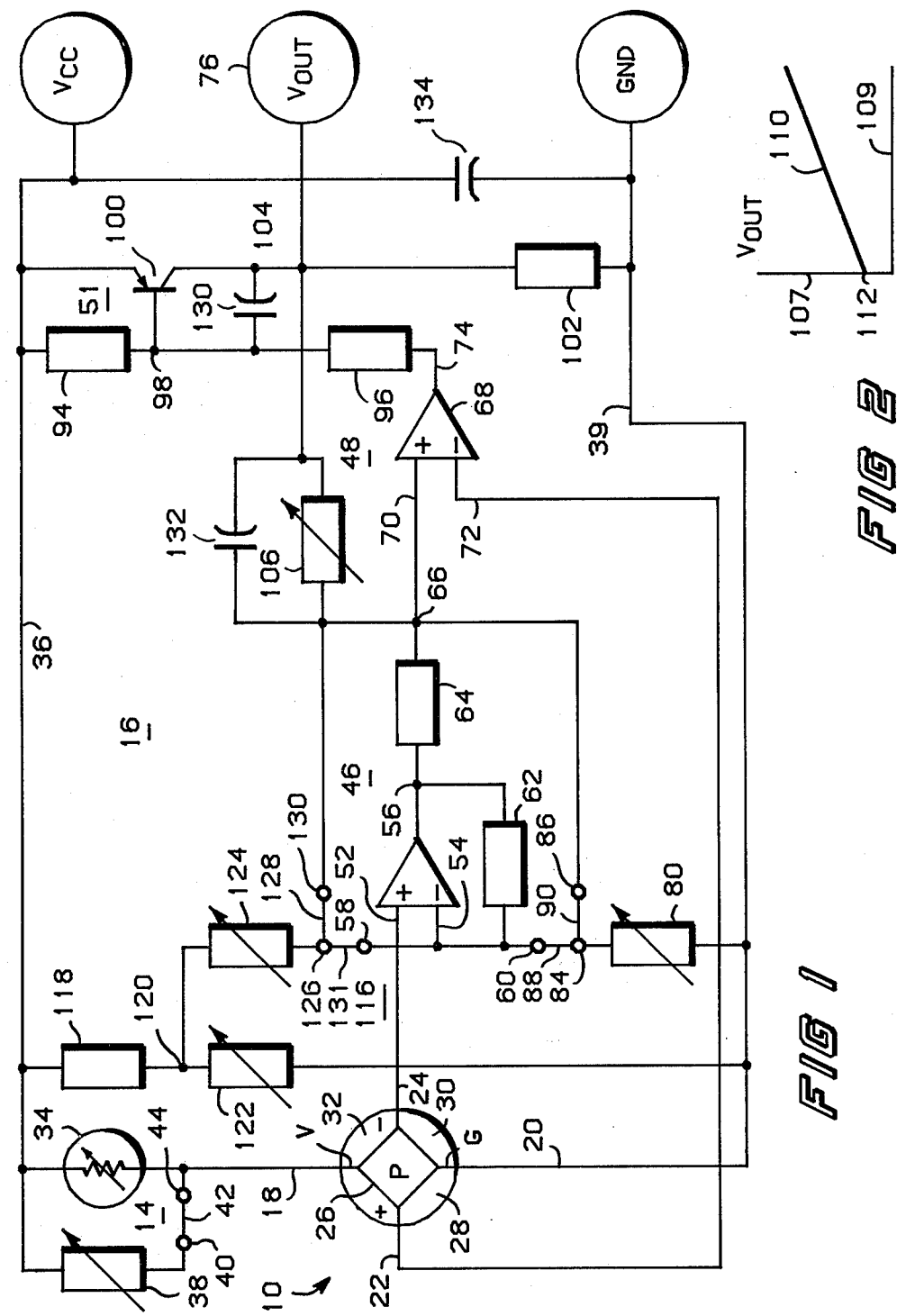

TEMPERATURE COMPENSATING PRESSURE SENSOR AMPLIFIER CIRCUITS

BACKGROUND OF THE INVENTION

1. Field of the Invention

This invention relates generally to pressure sensor amplifier circuits and more particularly to circuitry which temperature compensates both itself and a semiconductor pressure sensor connected thereto.

2. Description of the Prior Art

Modern automobile engine control system presently require pressure responsive transducers and circuitry for engine management. More specifically, some such systems utilize manifold pressure sensors and amplifier circuits which provide an analog control signal which is a function of the engine manifold pressure. An analog-to-digital converter transforms the analog control signal into a digital control signal which is utilized by a microprocessor, for example, to control fuel injection.

Unfortunately, most semiconductor pressure transducers have undesirable temperature characteristics which are different for different transducers. More specifically, the sensitivity of the output signal to pressure change and the offset voltage of such devices undesirably vary with temperature change. The temperature coefficient of "span" or change in voltage output versus change in pressure typically has a negative temperature coefficient having a range of magnitude for different transducers. Offset voltage, which is the differential output voltage of the transducers at zero pressure, can have either a positive or a negative temperature coefficient each with a range of magnitudes for different transducers.

A prior art configuration for temperature compensating span utilizes a plurality of thermistors which vary the magnitude of the excitation voltage across the transducer to compensate for the undesirable changes in sensitivity with temperature. More specifically, a pressure transducer of one type can be considered as a bridge circuit and the thermistors are connected from each power input terminal of the bridge to a power supply line. The thermistors change the excitation voltage level so that the output voltage across the terminals of the bridge remain constant for a given change in pressure even though the temperature changes. Also, such thermistors have been shunted with temperature stable elements such as resistors to tailor the compensation characteristic. The combination of resistors, thermistors, and transducers has been adjusted by laser trimming through iterative operations over temperature to provide a composite device having a desired degree of temperature independence. These adjustments usually include sequential measurements over temperature and trimming. Such elements can also be trimmed to compensate for the undesired temperature dependence of the transducer offset voltage.

The above prior art techniques and configurations tend to be expensive because of the cost of discrete precision components and the complex trimming procedure. Moreover, even if the transducer and temperature compensating elements are trimmed to provide the desired temperature characteristics, the amplifier circuitry utilized with such compensated transducer configurations also tend to provide undesired temperature effects on the amplified analog output voltage.

SUMMARY OF THE INVENTION

An object of the present invention is to provide transducer amplifier circuits which require only one temperature variable element for temperature compensation of the span and offset voltage of the transducer.

Another object of the invention is to provide transducer amplifier circuits which enable a simplified trimming procedure for temperature compensation.

A further object of the invention is to provide transducer amplifier circuits which compensate for undesired temperature effects inherent in both the pressure sensor and in the circuitry.

A still further object is to provide transducer amplifier circuits which compensate for the effect of initial offset of the transducer.

Briefly, an amplifier circuit of one embodiment temperature compensates the magnitude of the output voltage at an output terminal thereof. The amplifier circuit includes a first and second amplifier stages. A first circuit connects the output terminal of the first amplifier stage through a summing node to the first input terminal of the second amplifier stage. Differential driving signals are applied between the first input terminal of the first amplifier stage and the second input terminal of the second amplifier stage. A temperature compensation circuit is selectively coupled to the summing node for enabling the output voltage of the amplifier to be substantially independent of temperature. Also an initial offset voltage adjusting network is selectively coupled to the summing node for adjusting the magnitude of the output voltage in response to zero pressure.

BRIEF DESCRIPTION OF THE DRAWINGS

FIG. 1 is a partial block and schematic drawing of a module including a pressure sensor and an amplifier circuit; and FIG. 2 is a graph of the output voltage versus pressure for the combination of FIG. 1.

DETAILED DESCRIPTION OF THE PREFERRED EMBODIMENT

FIG. 1 depicts silicon pressure sensor or transducer 10, span temperature compensating network 14, and composite amplifier 16. Silicon pressure sensor 10 may be considered to be a bridge circuit having excitation terminals 18, 20, a positive output terminal 22 and a negative output terminal 24. Resistive elements 26, 28, 30 and 32 are respectively connected between terminals 18, 22; 22, 20; 20, 24; and 24, 18, respectively. Excitation terminal 18 is electrically coupled through thermistor 34 to positive power supply conductor 36. Resistor 38 has one end connected to power supply rail 36 and another to terminal 40. Jumper 42 can be connected between terminal 40 and terminal 44, which is connected to one end of thermistor 34 and to terminal 18 of transducer 10. Thermistor 34 and resistor 38 are shown as variable elements because their electrical characteristics can be adjusted, for instance, by laser trimming. Jumper 42 is needed to allow independent trimming of resistor 38 and thermistor 34, as will be explained later. Excitation terminal 20 of pressure sensor 10 is connected to negative or ground power supply conductor 39.

Under quiescent or zero pressure conditions, differential output terminals 22 and 24 of pressure sensor 10 are each biased at about one-half of the magnitude of the voltage between terminals 18 and 20, i.e. about 3 volts.

As pressure is applied to sensor 10, the magnitude of the voltage at the positive output terminal 22 tends to increase and the magnitude of the voltage at negative output terminal 24 tends to decrease thereby creating a differential output voltage therebetween. Unfortunately, the sensitivity or span of transducer 10 tends to decrease with increase in temperature. This means that as the temperature increases a given change in pressure on sensor 10 will produce less differential voltage between terminals 22 and 24. The differential signal change is typically between 50 and 100 millivolts for a change in pressure of 15 psi. This change in differential voltage due to pressure is nearly linear over the pressure range of interest.

Span Compensation

Silicon pressure transducers can be of various types by way of their construction or design. Different types of transducers 10 can have different negative temperature coefficients of span. Thus, thermistor 34 and resistor 38 must be adjusted for each type of transducer to compensate for the change in span with temperature by adjusting the magnitude of the excitation voltage at terminal 18 with temperature which affects the differential output voltage between terminals 22 and 24. For transducers of the same type the span can be compensated over a temperature range of between −20° C. to 100° C. to provide a variation in transducer output voltage at any pressure of interest of no more than one to five percent error.

Since the resistance of network 14 tends to decrease with temperature the voltage across terminals 18 and 20 tends to increase to compensate the span, and the common mode voltages at terminals 22 and 24 each with respect to conductor 39, tend to increase. However, the differential voltage between terminals 22 and 24 is not effected by this change in common mode voltage. The use of network 14 ultimately enables the output voltage of amplifier 16 to be ratiometric with the supply voltage which means that the magnitude of the analog output potential of amplifier 16 is always the same percentage of the supply voltage between rails 36 and 39.

Network 14 is trimmed by first adjusting the value of the thermistor 34 for a calculated voltage value at terminal 18 with respect to conductor 39. Then jumper 42 is applied and resistor 38 is adjusted to a higher calculated voltage value at terminal 18. The values are calculated based on temperature changes found in transducer 10, resistor 38, and thermistor 34.

Composite Amplifier

Composite amplifier 16 includes two differentially connected stages 46 and 48. Stage 46 includes operational amplifier 50 which has a non-inverting or positive input terminal 52, a negative or inverting input terminal 54, and an output terminal 56. Non-inverting terminal 52 is coupled to negative output terminal 24 of pressure transducer 10 and inverting input terminal 54 is connected to jumper terminals 58 and 60. Feedback resistor 62 is connected between inverting terminal 54 and output terminal 56 of amplifier 50. Resistor 64 is connected between output terminal 56 of amplifier 50 and summing node 66 of second stage 48. Amplifier stage 46 operates as a voltage follower which has a small voltage gain, a large current gain, and a large input impedance.

Second stage 48 includes operational amplifier 68 having a non-inverting input terminal 70 connected to summing node 66 and an inverting input terminal 72 which is connected to positive output terminal 22 of transducer 10. Output terminal 74 of amplifier 68 is connected through inverting output driver circuit 51 to output terminal 76 which is fed back to input terminal 70 through resistor 106.

In operation, as pressure is applied to transducer 10, the common mode voltage at terminal 22 increases and the common mode voltage at terminal 24 decreases. Amplifier 50 responds to the decreasing potential at terminal 52 by providing a decreasing potential at node 56 which causes current to flow through resistor 64 to input terminal 70. Amplifier 68 responds to the current flow through resistor 64 and the increasing potential at terminal 72 by decreasing the potential at output terminal 74. Output stage 51 inverts the decreasing signal at terminal 74 to provide an increasing potential at output terminal 76. The amplifier 68 continues to control the potential at terminal 76 through output stage 51 until the voltage at terminals 70 and 72 are the same. Such behavior is well understood by those skilled in the art of operational amplifier design.

Initial Offset Voltage Compensation

The initial offset voltage of transducer 10 is the differential voltage between terminals 22 and 24 with no pressure applied to the transducer. Negative offset, for example, means that the common mode voltage at terminal 24 is greater than the common mode voltage at terminal 22. The offset voltage is created because the resistances of elements 26, 28, 30, and 32 are not exactly equal to each other, for instance.

Initial offset voltage adjusting resistor 80 has one end connected to negative supply conductor 39 and another end connected to jumper terminal 84. Summing node 66 is connected to jumper terminal 86. Terminal 84 can be either connected to terminal 60 through jumber 88 or to terminal 86 through jumper 90. Jumper 88 is utilized to connect offset resistor 80 to negative input 54 of operational amplifier 50. Alternatively, jumper 90 is utilized to connect offset resistor 80 to the positive input of operational amplifier 68.

The particular jumper selected depends on the polarity of the initial offset voltage. The magnitude of resistor 80 is trimmed to adjust effect of the magnitude of the initial offset voltage and the offsets of both amplifiers, 50 and 68, on the output voltage at terminal 76. More specifically, jumper 88 is utilized to compensate for too much positive initial offset which makes the output voltage too positive. Jumper 90 is utilized to compensate for too much negative initial offset which makes the output voltage too negative. Jumper 88 allows amplifier 50 to put more current into summing junction 66 or jumper 90 takes current out of summing junction 66 to adjust the magnitude of the output voltage at terminal 76 with zero pressure applied to transducer 10.

Output Stage

Output stage 51 includes a voltage divider having resistors 94 and 96 connected between output terminal 74 of operational amplifier 68 and positive supply conductor 36. Junction 98 between these resistors is connected to the base electrode of PNP driver transistor 100 which has an emitter electrode connected to supply conductor 36 and a collector electrode which is connected to composite amplifier output terminal 76. One end of resistor 102 is connected to the collector of transistor 100 and output terminal 76 at node 104. The other end of resistor 102 is connected to the negative supply conductor 39. A feedback network including gain control resistor 106 connects node 104 to summing junction 66 of amplifier 48.

Standard operational amplifier 68 is internally limited by the design thereof so that it cannot drive output terminal 74 to voltage magnitudes approaching the supply potential magnitude on conductor 36. Output stage 51 amplifies the output signal of amplifier 68 so that output terminal 76 can be driven to potentials approaching the supply potential on conductor 36. Resistors 94 and 96 enable amplifier 68 to remain in its active region. As amplifier 68 drives the magnitude of the voltage at terminal 74 up and down, a control voltage is provided at node 98 which is amplified by transistor 100 which swings the output voltage at terminal 76 from near the negative or ground potential on conductor 39 to near the magnitude of the voltage on positive conductor 36. Resistor 102 is required to provide a path for current to the negative conductor 39 when transistor 100 is not conducting current from positive conductor 36.

Output stage 51 provides a signal inversion, which necessitates input terminal 70 and 72 of op amp 68 to be reversed as compared to the typical connection of operational amplifier 68 as an inverting amplifier. Resistors 80 and 106 can also be trimmed so that amplifier 48 provides a desired amount of voltage gain and initial offset.

FIG. 2 depicts output voltage at terminal 76 along ordinate axis 107 versus pressure applied to transducer 10 along abscissa 109. Graph 110 is representative of the transfer function of transducer 10 plus circuit 16. As previously explained, adjustment of resistor 80 establishes the location of intercept 112 and adjustment of resistor 106 establishes the slope of graph 110.

Compensation for Offset Voltage Change over Temperature

Assuming a given supply voltage magnitude and pressure, as the temperature rises the resistance of thermistor 34 becomes smaller and thus the excitation voltage across transducer 10 becomes larger. Consequently, the magnitudes of the common mode voltages at terminals 22 and 24 with respect to conductor 39 become larger. Thus, the voltages at input terminal 72 of amplifier 68 and the voltage at input terminal 52 of amplifier 50 rise. As a result, amplifier 50 and 68 try to force respective inputs 54 and 70 to higher voltage levels through their respective feedback paths.

If the voltages at nodes 56 and 66 rise at the same rate there will be no effect on the magnitude of the current flowing through resistor 64 and consequently there is no effect on the magnitude of the current through resistor 106. Thus the voltage at output terminal 76 will remain constant with temperature change. However, if the voltages at nodes 56 and 66 do not track each other exactly with temperature, then a misbalance occurs which tends to cause the current to undesirably change in resistor 64 as a function of temperature. This undesirable difference in tracking can be caused by the offset voltage temperature coefficients of transducer 10, amplifier 50, and/or amplifier 68. Consequently, amplifier 68 tends to undesirably change the voltage at output terminal 76 with temperature to correct for the misbalance by changing the current in resistor 106.

Offset temperature compensation network 116 is utilized to enable the magnitude of the voltage at output terminal 76 to be substantially independent of temperature. Network 116 includes resistor 118 which has one end connected to supply conductor 36 and another end connected to node 120. Trimmable resistors 122 and 124 each have one end also connected to node 120. The other end of resistor 122 is connected to negative supply conductor 39 and the other end of resistor 124 is connected to jumper terminal 126. Jumpers 128 and 131 can be utilized for respectively connecting terminal 126 to either terminal 130 or to terminal 58 depending on the polarity of the undesired temperature induced drift at output terminal 76. Resistors 118, 122 and 124 are selected to have resistances which are essentially or substantially temperature independent. The temperature stable voltage at node 120 is selected by trimming resistor 122 to have the same magnitude as the voltage at node 66 at the temperature at which the offset resistor 80 and gain resistor 106 are trimmed. Also the applied pressure is typically the midscale value as the voltage at node 66 will vary slightly with applied pressure since input 72 of amplifier 68 is pressure dependent. Then a temperature compensating current is either added to summing node 66 through jumper 128 or in effect taken away from summing node 66 if jumper 131 is utilized to provide the desired temperature compensation. The magnitude of the temperature compensating current is adjusted by trimming resistor 124.

Frequency Compensation

Capacitor 130 which is connected between the collector and base electrodes of transistor 100 and capacitor 132 which is connected across resistor 106 tend to stabilize the output of amplifier 68. More specifically, output stage 51 tends to increase the overall gain of amplifier 16 which provides a tendency for oscillation. Capacitor 130 tends to damp out the oscillation by providing a larger amount of negative feedback as the frequency increases. Capacitor 132 tends to filter out the high frequency noise components. Capacitor 134 is connected between conductors 36 and 39 to provide supply voltage decoupling with respect to radio frequency interference, for example.

Circuit Values

Circuit 10 enables the use of stable resistors having low resistances which facilites implementation in hybrid form. The following table shows typical values.

| Resistor | Resistance in Ohms |
|----------|---------------------|
| 38 | 200–400 |
| 62 | 100 |
| 64 | 100 |
| 80 | 1–100K |
| 94 | 15K |
| 96 | 25K |
| 102 | 1.5K |
| 106 | 5–15K |
| 118 | 1K |
| 122 | 400–600 |
| 124 | 1–200K |

Transducer 10 can have a resistance of about 400 ohms. Thermistor 34 can have a $\beta = 1250$ and a resistance of 500–600 ohms.

Therefore, a transducer amplifier circuit 16 has been described which requires only one temperature variable element 34 for temperature compensation of the span and offset of transducer 10. Thermistor 34 along with resistor 38 directly temperature compensates the span of transducer 10. Network 116 when properly utilized with jumper 128 or 131 compensates for temperature effects of the offset voltage of transducer 10, and the offset voltages of amplifiers 50 and 68. Since only one temperature dependent element 34 and one shunting resistor 38 is required by amplifier configuration 16, trimming of the amplifier and transducer are simplified. The network including resistor 80 facilitates compensation for the effect of the initial offset voltage of transducer 10 at output terminal 76. Resistor 106 facilitates adjustment of the gain or slope of the output at terminal 76 versus pressure applied to transducer 10.

We claim:

1. An amplifier circuit suitable for temperature compensating the output voltage including in combination:

first amplifier means having a first input terminal, second input terminal and an output terminal;

second amplifier means having a first input terminal, a second input terminal and an output terminal;

first circuit means connecting said output terminal of said first amplifier means through a summing node to said first input terminal of said second amplifier means;

second circuit means for applying differential driving signals between said first input terminal of said first amplifier means and said second input terminal of said second amplifier means;

third circuit means connecting said output terminal of said second amplifier means to the output terminal of the amplifier circuit;

a first power supply conductor;

a second power supply conductor; and temperature compensation means coupled to said summing node for enabling said output voltage of the amplifier to be substantially independent of temperature, said temperature compensation means including a first resistive element having one end connected to said first power supply conductor, a second resistive element having one end connected to a second end of said first resistive element and having another end connected to said second power supply conductor, and a third resistive element having one end connected to said second end of said first resistive means and a second end which can be selectively electrically connected to said summing node or to said second input terminal of said first amplifier means.

2. The amplifier circuit of claim 1 further including initial offset voltage compensating means coupled to said summing node.

3. The amplifier circuit of claim 1 wherein said second circuit means includes a silicon pressure transducer having a temperature compensating network having only one temperature variable component connected thereto.

4. The circuit of claim 3 wherein said temperature compensating element includes a thermistor.

5. The amplifier circuit of claim 1 wherein said third circuit means includes an output driver amplifier circuit.

6. The amplifier circuit of claim 1 wherein said temperature compensation means includes a passive resistive network having resistors with resistances that are substantially independent of temperature.

7. A composite amplifier circuit suitable for temperature compensating the output voltage at an output terminal thereof for temperature induced changes resulting from a silicon pressure transducer and from components within the amplifier itself; such amplifier including in combination:

a first operational amplifier stage having a first input terminal, a second input terminal and an output terminal, said first operational amplifier stage possibly providing undesired temperature induced signals;

a second operational amplifier stage having a first input terminal, a second input terminal and an output terminal, said second operational amplifier stage possibly providing undesired temperature induced signals;

first circuit means including a first resistive means electrically connecting said output terminal of said first amplifier stage through said first resistive means to a summing node at said first input terminal of said second operational amplifier stage;

transducer means applying differential driving signals between said first input terminal of said first operational amplifier stage and said second input terminal of said second operational amplifier stage, said differential driving signal tending to have an undesired temperature coefficient which tends to cause the output voltage of the composite amplifier to undesirably drift with temperature change;

a first power supply conductor;

a second power supply conductor; and temperature compensation means including passive elements which can be selectively connected to one of said summing node and said second input terminal of said first operational amplifier, said temperature compensation means being selectively trimmable to provide control signals to said summing node which compensate for undesired temperature induced signals to said summing node so that said output voltage of the amplifier tends to be substantially independent of temperature, said temperature compensation means including a first resistive element having one end connected to said first power supply conductor; a second resistive element having one end connected to a second end of said first resistive element and another end connected to said second power supply conductor, and a third resistive element having one end connected to said second end of said first resistive means and a second end which can be selectively electrically connected to said summing junction or to said second input terminal of said first operational amplifier stage.

8. The amplifier circuit of claim 7 including a ground conductor and having an initial offset voltage compensating means with a resistive means having one end connected to said ground conductor and another end for being selectively connected to said second input terminal of said first operational amplifier stage or to said first input terminal of said second operational amplifier stage, said resistive means having an adjustable resistance.

* * * * *